(12) United States Patent
Ohashi

(10) Patent No.: US 6,252,216 B1
(45) Date of Patent: Jun. 26, 2001

(54) SOLID STATE IMAGE PICK-UP DEVICE

(75) Inventor: Masanori Ohashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/149,034

(22) Filed: Sep. 8, 1998

(30) Foreign Application Priority Data

Sep. 8, 1997 (JP) .................................................. 9-242249

(51) Int. Cl.$^7$ .......................... H01L 21/00; H01L 27/146
(52) U.S. Cl. ...................... 250/208.1; 250/216; 257/432; 438/69
(58) Field of Search ............................. 250/208.1, 214.1, 250/214 R, 216; 359/619, 623, 624; 257/231, 232, 233, 432, 433; 438/57, 69, 71, 73

(56) References Cited

U.S. PATENT DOCUMENTS 5,534,720 * 7/1996 Song et al. ............................. 257/232
5,672,519 * 9/1997 Song et al. ............................. 438/69

* cited by examiner

*Primary Examiner*—John R. Lee
(74) *Attorney, Agent, or Firm*—Sonnenschein, Nath & Rosenthal

(57) ABSTRACT

A solid state image pick-up device comprises a plurality of light receiving sensors which perform photoelectric conversion being disposed in a matrix form on the surface of a substrate, charge transfer portions for transferring signal charges, transfer electrodes positioned in the upper portions of the charge transfer portions and an interlayer insulating layer, and over the interlayer insulating layer a first stripe-on-chip lenses having approximate semicylindrical shapes are formed along the vertical or horizontal lines of light receiving light sensors and a second stripe-on-chip-lenses having an approximate semicylindrical shapes are formed over the first stripe-on-chip-lenses in a direction making a right angle with that of the first stripe-on-chip-lenses. The radius of curvature of the first stripe-on-chip-lenses and the second stripe-on-chip-lenses can be decided independent from each other, so that the optimum light condensing conditions are easily obtained, which makes it possible to obtain a solid state image pick-up device of excellent light sensitivity characteristics.

32 Claims, 4 Drawing Sheets

FIG. IA
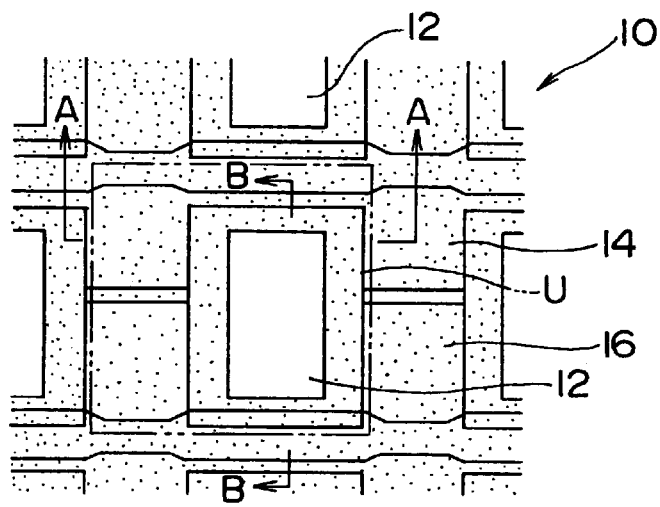
FIG. IB
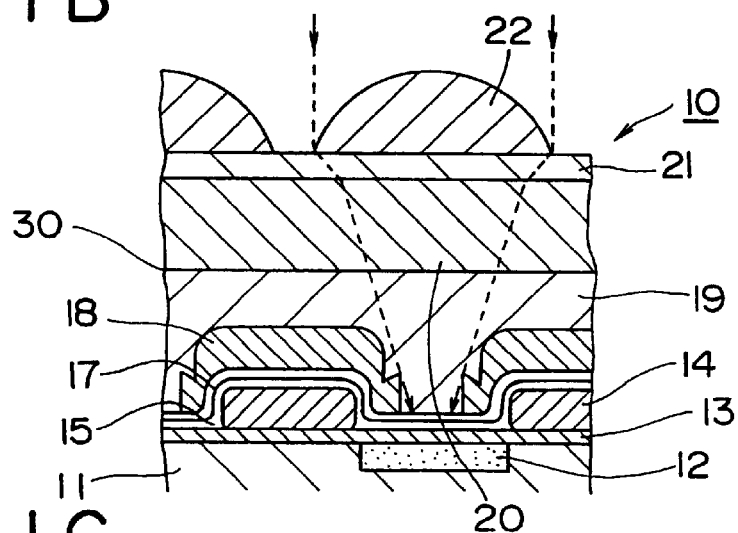
FIG. IC
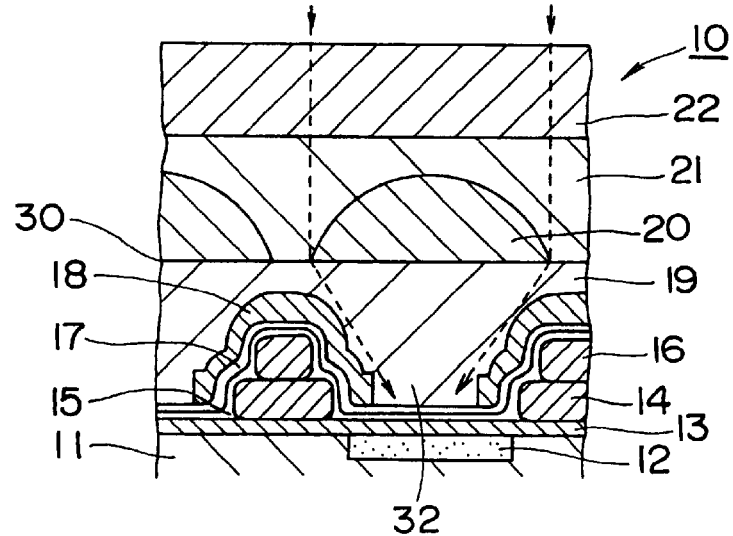

SOLID STATE IMAGE PICK-UP DEVICE

BACKGROUND OF THE INVENTION

The present invention includes to a solid state image pick-up device in which sensitivity characteristics are graded up in improving condensing efficiency of light to be led to a light receiving sensor.

In recent years, in the case of solid state image pick-up devices, the tendency of miniaturizing or high density arrangement of pixels has been promoted. Along with the promotion or such a tendency the light receiving area of an device is made smaller. This causes the degradation of characteristics such as the deterioration in sensitivity or the increase in smear.

As a measure to counter the deterioration in sensitivity, for example, on-chip-lenses (OCL) are provided on respective units of pixels. This may effectively utilize the incident light on pixels for the purpose of grading up the condensing efficiency of light to be led to light receiving sensors.

An ordinary manufacturing method of on-chip-lenses is discussed next. As shown in FIG. 4A, on a substrate 1, on which respective constitutional devices of solid state image pick-up devices 400 are formed, a smoothing layer 2 and a color filter layer 3 are formed. Over the color filter layer 3 a lens material made of resin, etc. is applied. The applied lens material is patterned to form dots to cover respective pixels formed on the substrate 1, thus a lens pattern 4 is formed.

After that, the lens pattern 4 is heated at a temperature of 150 to 200° C. for a thermal reflow process, and on-chip-lenses 5 of convex shapes are obtained as shown in FIG. 4B.

In the case of solid state image pick-up device 400, the aspect ratio of a unit pixel is changed by the type of image pick-up device. With the change in the aspect ratio of a unit pixel, the aspect ratio of the lens pattern 4 is also changed; therefore, the shape of an on-chips-lens 5 which is obtained as the result is also changed with the change of the type of image pick-up device.

On-chip-lenses 5 are originally formed to improve the condensing efficiency of light to be led to light receiving sensors. In order to optimize the condensing efficiency of light in any type of an image pick-up device, the shape of the on-chip-lens 5 has to be changed independent from the aspect ratio of a unit pixel. It is possible to adjust the radius of curvature of an on-chip-lens 5 to have a desirable form by properly selecting the thickness of an applied film of a lens material, the volume and the shape of a lens pattern 4 formed like scattered dots, and further the reflow temperature at a reflow process.

SUMMARY OF THE INVENTION

Generally, in the case of a solid state image pick-up device, the unit pixel U has a square shape as shown with a two-dot chain line in FIG. 5A, and since a transfer electrode 6 or the like is disposed in the unit pixel U, the shape of an opening portion (light receiving portion) 7 of the light receiving sensor becomes a rectangle. Therefore, if the shape of the bottom surface of an on-chip-lens 5 is a circular form as shown in FIG. 5B, a square with its corners rounded as shown in FIG. 5C, or an elliptical form (not shown in a figure), the areas on which an on-chip-lens 5 is not formed can be produced, and in the result, these areas become useless and enough high condensing efficiency of light cannot be obtained.

On the other hand, when it is intended to decrease the useless areas to the utmost to improve the condensing efficiency of light with an on-chip-lens, it is needed that the shape of the bottom surface of the on-chip-lens 5 is a square to meet the shape of a unit pixel U. However, it is difficult to make a convex lens having the square shaped bottom surface with the present techniques in which a lens pattern 4 is reflow-processed to form a convex lens as described in the above, and an on-chip-lens may be shaped to be a square with its corners rounded as shown in FIG. 5C, or a shape which is deviated from the optimum shape to lead an incident light securely to the opening portion 7 of the light receiving sensor.

When the corners of an on-chip-lens are rounded as shown in FIG. 5C, as described in the above, four corners of a unit pixel U become useless areas, and when the shape is deviated from the optimum shape, a light incident on the corners of the on-chip-lens is apt to be led into an edge part of the opening portion 7 of the light receiving sensor, and in some cases it can be reflected toward the on-chip-lens again, or in some case it can be a smear component which degrades characteristics.

The present invention was invented in consideration of the above mentioned circumstances, and the purpose of it is to offer a solid state image pick-up device in which useless areas are not produced in the corners of a unit pixel and almost the whole area of the unit pixel becomes an effective area for collecting light. Therefore, the condensing efficiency of light will be enhanced and a solid state image pick-up device having improved sensitivity characteristics will be obtained.

A solid state image pick-up device according to the present invention comprises a plurality of light receiving sensors which perform photoelectric conversion being disposed in vertical and horizontal directions on the surface of a substrate, electric charge transfer portions which transfer signal charges read out from the light receiving sensors, transfer electrodes disposed approximately right upper positions of the electric charge transfer portions on the substrate with an insulating film therebetween, and a smoothing layer covering the transfer electrodes, and over the smoothing layer, first stripe-on-chip-lenses having approximate semi-cylindrical shapes are formed along the vertical or horizontal lines of the light receiving sensors covering the light receiving portions of the light receiving sensors, and upon the first stripe-on-chip-lenses, second stripe-on-chip-lenses having approximate semicylindrical shapes are formed along the other vertical or horizontal lines of the light receiving sensors covering the light receiving portions of the light receiving sensors.

In the case of the solid state image pick-up device according to the present invention, the first stripe-on-chip-lenses and the second stripe-on-chip-lenses, both having approximate semicylindrical shapes, are formed along the vertical or horizontal lines of the light receiving sensors in different directions from each other; thereby, the first stripe-on-chip-lenses and the second stripe-on-chip-lenses are disposed making a right angle with each other when they are viewed in a plan view, so that the condensing of light in X direction can be done by the lenses in a direction and that in Y direction can be done by the lenses in another direction. Therefore, the condensing of light in both X and Y directions is made possible by forming the second stripe-on-chip-lenses overlapped upon the first stripe-on-chip-lenses.

The overlapping areas of the first stripe-on-chip-lenses and the second stripe-on-chip-lenses viewed in a plan view are square or rectangular shaped, and since the condensing of light in both X and Y directions is made possible in the overlapping areas, an incident light can be securely led to the light receiving sensor even at the corners of a light receiving sensor and further of a unit pixel including the light receiving sensor portion.

As explained in the above, in the case of a solid state image pick-up device according to the present invention, the first stripe-on-chip-lenses and the second stripe-on-chip-lenses having approximate semicylindrical shapes are formed along the vertical or horizontal lines of light receiving sensors in different directions from each other; thereby since the first stripe-on-chip-lenses and the second stripe-on-chip-lenses are disposed in making a right angle with each other when they are viewed in a plan view, the condensing of light in X direction can be performed with a group of lenses and the condensing of light in Y direction can be performed with another group of lenses.

Therefore, it is made possible to perform condensing of light in both X and Y directions right above the light receiving portions of the light receiving sensors where the first stripe-on-chip-lenses and the second stripe-on-chip-lenses are overlapped. Thereby, an incident light can be securely led to a light receiving sensor.

The overlapped portions of the first stripe-on-chip-lenses and the second stripe-on-chip-lenses viewed in a plan vies have square or rectangular shapes, and since the condensing of light in both X and Y directions is made possible in these overlapped portions, even at the corners of a light receiving sensor further of a unit pixel including a light receiving sensor, an incident light can be securely led into a light receiving sensor unlike the conventional solid state image pick-up device, which has been difficult to lead the light incident on the corners into the inside of an light receiving sensor. Accordingly it makes possible to improve the light condensing efficiency all the more.

Further, even in the case where a light receiving portion of a light receiving sensor has a rectangular shape, it is possible to provide an stripe-on-chip-lens corresponding to the vertical direction and that corresponding to the horizontal direction with different radius of curvature, so that the optimum light condensing conditions can be easily prepared. Therefore, even if the light receiving portion (opening portion) of the light receiving sensor has any aspect ratio, it is easy to improve sensitivity characteristics in enhancing light condensing efficiency, which makes it possible to obtain a solid state image pick-up device having an excellent sensitivity characteristics.

BRIEF DESCRIPTION OF DRAWINGS

FIGS. 1A to 1C are drawings showing an embodiment of a solid state image pick-up device according to the present invention. FIG. 1A shows a plan view of an essential part, FIG. 1B shows a cross sectional view taken on line A—A in FIG. 1A, and FIG. 1C shows a cross sectional view taken on line B—B in FIG. 1A.

DETAILED DESCRIPTION OF THE PREFERRED EMBODIMENTS

Figure 2:
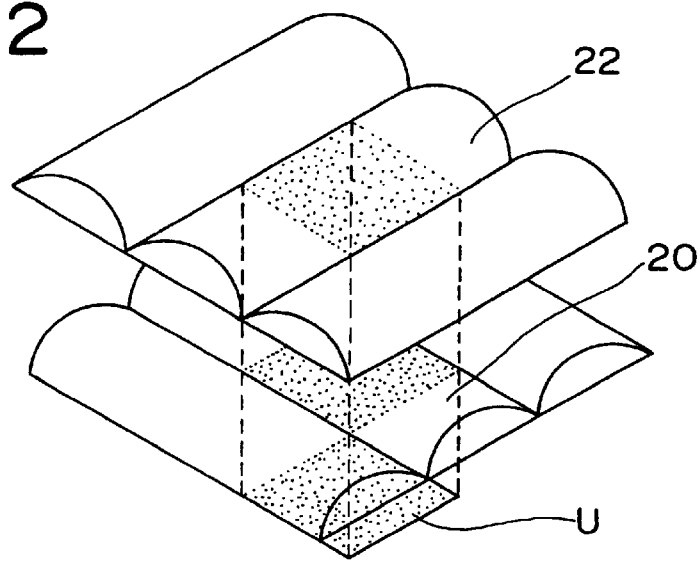
FIG. 2 shows a typical perspective view showing the state of the disposition of a first stripe-on-chip-lens and a second stripe-on-chip-lens.

In the following, the present invention will be explained in detail. FIGS. 1A to 1C show examples of an embodiment of a solid state image pick-up device according to the present invention. FIG. 1A shows a plan view of an essential part, FIG. 1B shows a cross sectional view taken on line A—A in FIG. 1A, and FIG. 1C shows a cross sectional view taken on line B—B in FIG. 1A. In FIGS. 1A to 1C, a reference numeral 10 denotes a solid state image pick-up device, and a reference numeral 11 denotes a silicon substrate.

A plurality of light receiving sensors 12 are formed being disposed in vertical and horizontal directions on the surface of the silicon substrate 11 as shown in FIGS. 1A and 1B. A readout portion (not shown in a drawing) and a charge transfer portion (not shown in a drawing) are formed in this order on a side of the light receiving sensor 12, and a channel stop (not shown in a drawing) is formed on the other side of it. The signal charge obtained by photoelectric conversion in the light receiving sensor 12 is read out by a charge transfer portion through the readout portion, and further it is transferred by the charge transfer portion.

An insulating film 13 made of $SiO_2$ and formed by a thermal oxidation method or Chemical Vapor Deposition (CVD) method is provided on the surface of the silicon substrate 11 as shown in FIG. 1B.

On the insulating film 13, a first vertical transfer electrode 14 made of polysilicon is formed at an approximately right upper position of the charge transfer portion (not shown in a drawing.) On the insulating film 13, there is further formed an interlayer insulating film 15 made of $SiO_2$ covering the first vertical transfer electrode 14.

A second vertical transfer electrode 16 is formed on the interlayer insulating film 15 as shown in FIG. 1C, and over the interlayer insulating film 15 another interlayer insulating film 17 is formed thereby covering the second vertical transfer electrode 16, and on the interlayer insulating film 17 a light shielding film 18 is formed. The light shielding film 18 is formed by opening a part of the right upper portion of the light receiving sensor 12, and it is made of a metal of high melting point such as aluminum, aluminum alloy, Ti or W.

A smoothing layer 19 is formed over the interlayer insulating film 17 covering the light shielding film 18. The smoothing layer 19 is formed with NSG (silicate glass), PSG (phosphorus silicate glass), and BPSG (boron phosphorus silicate glass) being accumulated by a CVD method, etc., and it functions as an interlayer insulating film and also it works to decrease the unevenness formed by the first vertical transfer electrode 14 and the second vertical transfer electrode 16 on the insulating film 13 formed on the silicon substrate 11. A smoothed color filter layer 30 is formed over the smoothing layer 19.

A plurality of the first stripe-on-chip-lenses 20 made of photosensitive resin and as such, are formed in parallel on the smoothing layer 19 through the color filter layer 30. The first stripe-on-chip-lenses 20 are formed being disposed along the vertical or horizontal lines of the light receiving sensors 12, and in this example as shown in FIGS. 1B and 1C, they are formed extending in straight lines in a direction making a right angle with the charge transfer direction of the first and the second vertical transfer electrodes 14 and 16. The first stripe-on-chip-lenses 20 are formed to have approximate semicylindrical shapes, and they securely cover all light receiving portions of the light receiving sensors 12, that is, they securely cover the opening portions 32 of the light shielding film 18, and further they are formed to cover almost the whole area of respective unit pixels including the light receiving sensors 12.

A smoothing layer 21 made of BPSG, etc. is formed on the smoothing layer 19 covering the first stripe-on-chip-lenses 20, and further on the smoothing layer 21, as shown in FIGS. 1B, 1C and FIG. 2, a plurality of second stripe-on-chip-lenses 22 made of a photosensitive resin, are formed in parallel to each other in a direction making a right angle with the first stripe-on-chip-lenses 20. Naturally, the smoothing layer 21 is formed with a material having a smaller index of refraction than that of the first stripe-on-chip-lenses. The second stripe-on-chip-lenses 20 22 are also formed and disposed along the vertical or horizontal lines of the light receiving sensors 12, and in this example, as shown in FIGS. 1B and 1C, they are formed extending in straight lines in the same direction as the charge transfer direction of the first and the second vertical transfer electrodes 14 and 16. The second stripe-on-chip-lenses 22 are also formed to have approximate semicylindrical shapes, and they are formed in a state where they securely cover respective light receiving portions of the light receiving sensors 12, that is, the opening 32 of the light shielding film 18, and further they are formed to cover almost the whole area of respective unit pixels U including the light receiving sensors 12.

In the production of a solid state image pick-up device 10, up to the manufacturing process of the smoothing layer 19 and further up to the formation of the color filter layer 30, the same process is used as the conventional process.

The first stripe-on-chip-lenses 20 are formed as shown in the following. A lens material such as a photosensitive resin is applied over the color filter layer 30 at a predetermined thickness and further it is patterned to form stripe-like pattern in the direction making a right angle with the charge transfer direction of the first and second vertical transfer electrodes 14 and 16. The pattern will be so formed that each stripe 20 has a width as close as to that of unit pixels U disposed in the direction making a right angle with the charge transfer direction of the first and the second vertical transfer electrodes 14 and 16, that is, each pattern will be formed being separated at a distance close to the resolution limit at exposure.

Figure 3A:
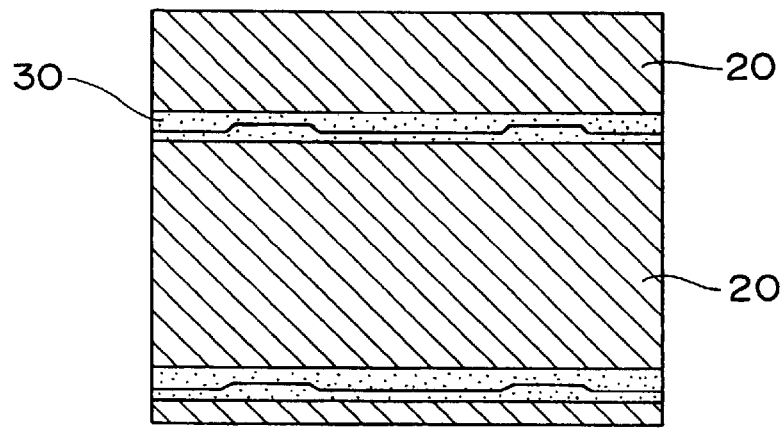
FIG. 3A shows a plan view showing the disposition of the first stripe-on-chip-lens.

The lens material having a stripe-like pattern is heated at a temperature of 150 to 200° C. for a reflow process, then the first stripe-on-chip-lenses 20 having approximate semicylindrical shapes are obtained as shown in a plan view shown in FIG. 3A.

Next, a smoothing layer 21 is formed in a state where it covers the first stripe-on-chip-lenses 20. When the smoothing layer 21 is reflow-processed by heat to smooth up, if there is a fear that the shapes of the first stripe-on-chip-lenses are changed, it is desirable that an etchback method is used.

When the smoothing layer 21 is formed in such a way, a lens material such as a photosensitive resin is again applied on the smoothing layer 21 at a predetermined thickness, coating on top of the color filter layer 30 and it is patterned to form a plurality of stripe-like pattern in the same direction as the charge transfer direction of the first and the second vertical transfer electrodes 14 and 16. A stripe 22 in the pattern will be also formed to have the width as close as possible to that of a unit pixel U in the same way as in the case of the first stripe-on-chip-lenses 20 are formed.

Figure 3B:
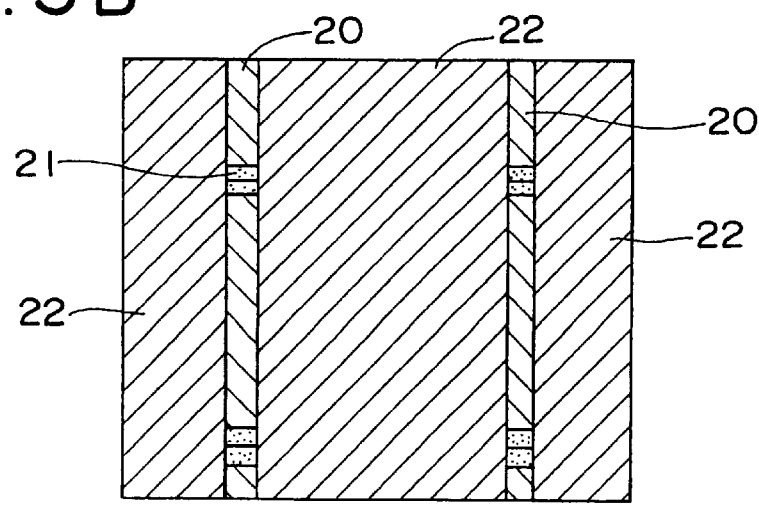
FIG. 3B shows a plan view showing the disposition of the second stripe-on-chip-lens.
Figure 4A:
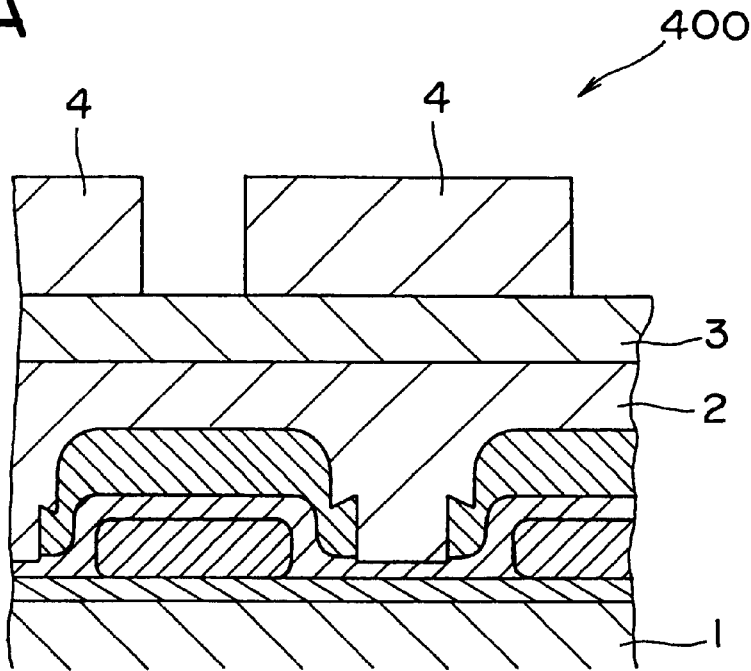
FIGS. 4A and 4B show cross sectional views of an essential part to be used for the explanation of an example of a manufacturing method of a conventional solid state image pick-up device in the order of manufacturing processes.
Figure 4B:
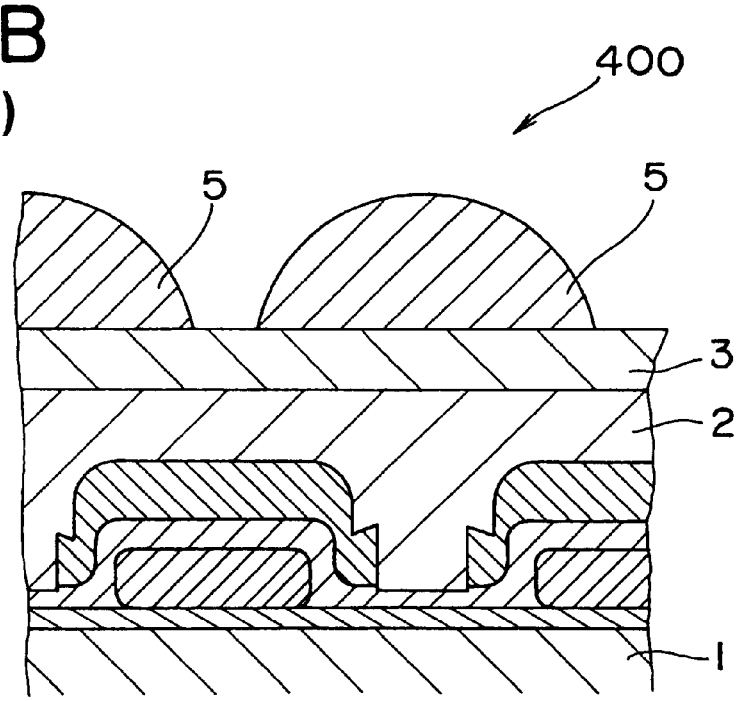
Figure 5A:
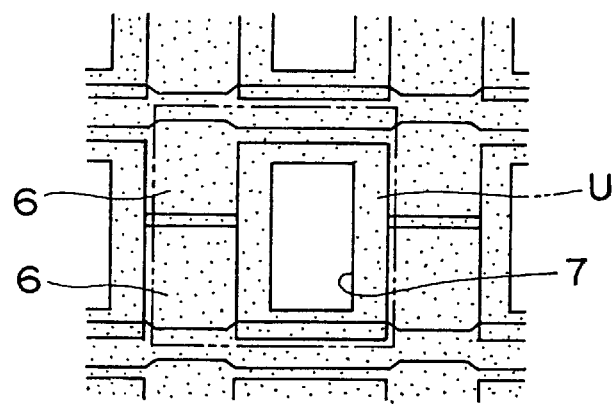
FIG. 5A shows a plan view of an essential part of a solid state image pick-up device.
Figure 5B:
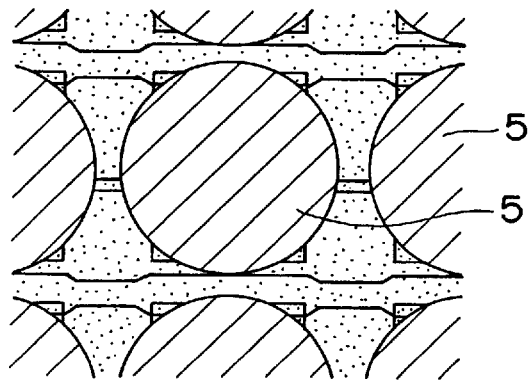
FIGS. 5B to 5D show plan views for explaining the shapes of bottom surfaces of conventional on-chip-lenses.
Figure 5C:
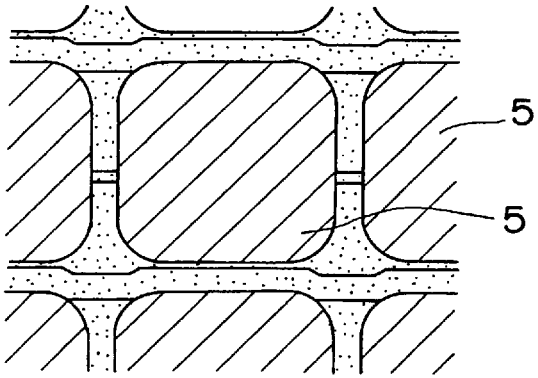
Figure 5D:
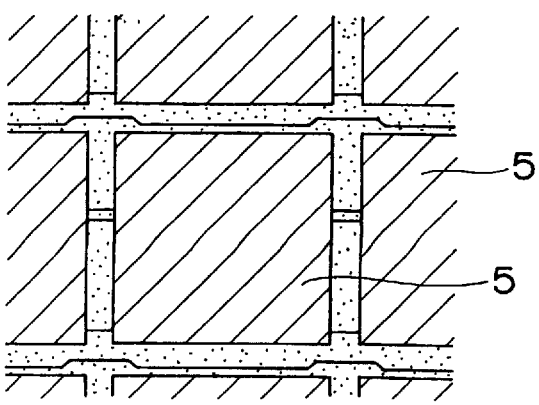

Next, the stripe-like pattern is heated at a temperature of 150 to 200° C. for a reflow process, then the second stripe-on-chip-lenses 22 having approximate semicylindrical shapes as shown in the plan view in FIG. 3B are obtained.

Since the first stripe-on-chip-lenses 20 and the second stripe-on-chip-lenses are formed as explained in the above, their radius of curvature can be formed independently from each other in adjusting the width of the stripes 20, 22 of the lens material. Therefore, in a case where the light receiving portion 32 (an opening portion of the light shielding film 18) of the light receiving sensor 12 has a rectangular form, lenses corresponding to the vertical direction and lenses corresponding to the horizontal direction are able to have different radius of curvature; thereby, the optimum light condensing conditions can be obtained.

In the case of a solid state image pick-up device 10 having the constitution as described in the above, the first stripe-on-chip-lenses 20 and the second stripe-on-chip-lenses 22 are disposed in the directions to have a right angle with each other when viewed in a plan view, so that the condensing of light in X direction can be performed by a group of lenses and the condensing of light in Y direction can be performed by the other group of lenses. Thereby, the right upper portion of a light receiving sensor 12 where these first and second stripe-on-chip-lenses 20 and 22, are overlapped, the condensing of light in both X and Y directions can be performed, which makes it possible to lead an incident light securely to the light receiving sensor 12.

The overlapped portions of the first stripe-on-chip-lenses 20 and the second stripe-on-chip-lenses 22 when viewed in a plan view have square or rectangular shapes, and even in these overlapped portions the condensing of light in both X and Y directions is possible, so that even at the corners of a light receiving sensor 12 and further of a unit pixel U including the light receiving sensor 12, an incident light can be securely led to the light receiving sensor 12, which improves the light condensing efficiency all the more.

Further, even when the light receiving portion 32 (an opening portion of the light shielding film 18) of a light receiving sensor 12 has a rectangular shape, the radius of curvature of a stripe-on-chip-lens corresponding to the vertical direction and that of another stripe-on-chip-lens corresponding to the horizontal direction can be different; thereby the optimum conditions for the condensing of light can be easily prepared.

In the above mentioned embodiment, over the first stripe-on-chip-lenses 20, the smoothing layer 21 is formed and over the smoothing layer 21 the second stripe-on-chip-lenses 22 are formed; however, the present invention is not limited to this, and if the lens material for the second stripe-on-chip-lens 22 is selected to have a smaller index of retraction than that of the lens 20 material for the first stripe-on-chip-lens, the smoothing layer 21 is not needed to form between the first and the second stripe-on-chip-lenses, 20 and 22, and the second stripe-on-chip-lenses 22 can be formed directly over the first stripe-on-chip-lens 20.

What is claimed is:

1. A solid state image pick-up device comprising:
   a plurality of light receiving sensors adapted to perform photoelectric conversion, wherein each light receiving sensor is positioned vertically and horizontally on a surface of a substrate;
   at least one charge transfer portion adapted to transfer signal charges read out from a light receiving sensor;
   at least one transfer electrode provided through an insulating film at an approximately right upper position of the at least one charge transfer portion on the substrate;

an interlayer insulating layer covering the at least one transfer electrode;

a first stripe on-chip lens disposed over the interlayer insulating layer and having an approximate semicylindrical shape that covers a light receiving portion of a light receiving sensor along one of the vertical and horizontal positions of the light receiving sensor; and a second stripe on-chip lens disposed over the first stripe on-chip lens and having an approximate semicylindrical shape that covers the light receiving portion of a light receiving sensor along the other of the vertical and horizontal position of the light receiving sensor.

2. A solid state image pick-up device according to claim 1, wherein the second stripe on-chip lens is formed over the first stripe on-chip lens through an interlayer insulating layer.

3. A solid state image pick-up device according to claim 1, wherein the second stripe on-chip lens is formed directly over the first stripe on-chip lens and the second stripe on-chip lens has a smaller index of refraction than that of the first stripe on-chip lens.

4. A solid state image pick-up device according to claim 1, wherein the interlayer insulating layer functions as a smoothing layer.

5. A solid state image pick-up device according to claim 1, wherein the first stripe on-chip lens is formed in a direction making a right angle with a signal charge transfer direction in the at least one charge transfer portion.

6. A method to manufacture a solid state image pick-up device, the method comprising:

disposing a plurality of light receiving sensors in the form of a matrix on the surface of a substrate, wherein the plurality of light receiving sensors are adapted to perform photoelectric conversion;

forming at least one charge transfer portion to transfer signal charges read out from the plurality of light receiving sensors;

positioning at least one transfer electrode at an approximately right upper position of the at least one charge transfer portion on the substrate through an insulating film;

covering the at least one transfer electrode with a smoothing layer;

forming a first lens material layer as an upper layer of the smoothing layer by applying a lens material on the smoothing layer at a predetermined thickness;

forming a first stripe on-chip lens having an approximate semicylindrical shape by patterning the first lens material layer into stripes in one of a same direction as that of a charge transfer direction of the at least one charge transfer portion and an orthogonal direction to the charge transfer direction;

forming a second lens material layer by applying a lens material on the first stripe on-chip lens as an upper layer; and forming a second stripe on-chip lens having an approximate semicylindrical shape by patterning the second lens material layer into stripe-like patterns in a direction that is orthogonal to that of the first stripe on-chip lens.

7. The method of claim 6, wherein a smoothing layer is formed between the first stripe on-chip lens and the second stripe on-chip lens.

8. The method of claim 7, wherein an etchback method is employed to smooth the smoothing layer.

9. The method of claim 6, wherein the second stripe on-chip lens is formed directly over the first stripe on-chip lens with a lens material having a smaller index of refraction than that of the first stripe on-chip lens.

10. The method of claim 6, wherein the first stripe on-chip lens is patterned in a direction that is orthogonal to the charge transfer direction of the at least one charge transfer portion.

11. A solid state image pick-up device comprising:

a plurality of light receiving sensors adapted to perform photoelectric conversion, wherein each light receiving sensor is positioned in a state of a matrix on a surface of a substrate;

a first stripe on-chip lens having an approximate semicylindrical shape covering a light receiving portion of a light receiving sensor along either a vertical or horizontal line, wherein the first stripe on-chip lens is disposed at an upper portion of the plurality of light receiving sensors; and a second stripe on-chip lens having an approximate semicylindrical shape covering a light receiving portion of a light receiving sensor along a different vertical or horizontal line of a light receiving sensor than the first stripe on-chip lens.

12. A solid state image pick-up device according to claim 11, wherein the second stripe on-chip lens is formed over the first stripe on-chip lens through an interlayer insulating layer.

13. A solid state image pick-up device according to claim 11, wherein the second stripe on-chip lens is formed directly over the first stripe on-chip lens and the second stripe on-chip lens has a smaller index of refraction than that of the first stripe on-chip lens.

14. A solid state image pick-up device according to claim 11, wherein the interlayer insulating layer functions as a smoothing layer.

15. A solid state image pick-up device, the device comprising:

a light receiving sensor defining a width and a length;

a first stripe on-chip lens disposed over the light receiving sensor in the direction of the width of the light receiving sensor; and a second stripe on-chip lens disposed over the light receiving sensor in the direction of the length of the light receiving sensor.

16. The device of claim 15, wherein the first stripe on-chip lens is disposed over the second stripe on-chip lens.

17. The device of claim 15, wherein the second stripe on-chip lens is disposed over the first stripe on-chip lens.

18. The device of claim 15, wherein the first stripe on-chip lens is disposed at a right angle to the second stripe on-chip lens.

19. The device of claim 15, wherein at least one of the first stripe on-chip lens and the second stripe on-chip lens defines a semicylindrical shape.

20. The device of claim 19, wherein the first stripe on-chip lens and the second stripe on-chip lens each define a semicylindrical shape.

21. The device of claim 20, wherein the first stripe on-chip lens defines a first radius of curvature and the second stripe on-chip lens defines a second radius of curvature, wherein the first radius of curvature is the result of a process that is independent of a process that forms the second radius of curvature.

22. The device of claim 21, wherein the first radius of curvature is different from the second radius of curvature.

23. The device of claim 15, wherein a width of at least one of the first stripe on-chip lens and the second stripe on-chip lens is at least equal to the width of the light receiving sensor.

24. The device of claim 15, further comprising:
   a first and second light shielding film,
   wherein the light receiving sensor is distributed between the first and second light shielding film to form a light receiving portion, and
   wherein a width of at least one of and the second stripe on-chip lens is at least equal to the width of the light receiving portion.

25. The device of claim 15, further comprising:
   a first and second lower transfer electrode, wherein the light receiving sensor is disposed between the first and second lower transfer electrode; and
   a first and second upper transfer electrode, wherein the light receiving sensor is disposed between the first and second upper transfer electrode.

26. The device of claim 25, further comprising:
   an insulating film disposed between the light receiving sensor and the first and second lower transfer electrode;
   a first interlayer insulating film disposed over the insulating film and each transfer electrode; and
   a second interlayer insulating film disposed over the first interlayer insulating film.

27. The device of claim 26, further comprising:
   a light shielding layer disposed over eac h transfer electrode so as to form a light receiving portion.

28. The device of claim 27, further comprising:
   a first smoothing layer disposed between the light shielding layer and the first stripe on-chip lens.

29. The device of claim 28, further comprising:
   a color filter layer disposed over the first smoothing layer.

30. A method to form a solid state image pick-up device, the method comprising:
   presenting a light receiving sensor defining a first direction and a second direction;
   disposing a first stripe on-chip lens over the light receiving sensor in the direction of the first direction of the light receiving sensor; and
   disposing a second stripe on-chip lens over the light receiving sensor in the direction of the second direction of the light receiving sensor.

31. The method of claim 30, wherein disposing the second stripe on-chip lens includes disposing the second stripe on-chip lens at a right angle to the first stripe on-chip lens.

32. The method of claim 31, wherein at least one of the first stripe on-chip lens and the second stripe on-chip lens defines a semicylindrical shape, and wherein the first direction is a width and the second direction is a length.

* * * * *